(12) United States Patent
Kilcoyne et al.

(10) Patent No.: US 10,236,226 B2
(45) Date of Patent: Mar. 19, 2019

(54) IN-SITU CALIBRATION STRUCTURES AND METHODS OF USE IN SEMICONDUCTOR PROCESSING

(71) Applicant: Raytheon Company, Waltham, MA (US)

(72) Inventors: Sean P. Kilcoyne, Lompoc, CA (US); Robert M. Emerson, Solvang, CA (US); Michael V. Liguori, Beullton, CA (US)

(73) Assignee: Raytheon Company, Waltham, MA (US)

( * ) Notice: Subject to any disclaimer, the term of this patent is extended or adjusted under 35 U.S.C. 154(b) by 189 days.

(21) Appl. No.: 15/070,384

(22) Filed: Mar. 15, 2016

(65) Prior Publication Data

US 2017/0271217 A1 Sep. 21, 2017

(51) Int. Cl.
*H01L 21/66* (2006.01)
*H01L 21/306* (2006.01)
(Continued)

(52) U.S. Cl.
CPC .......... *H01L 22/26* (2013.01); *B24B 37/013* (2013.01); *B24B 37/04* (2013.01); *B24B 37/105* (2013.01);
(Continued)

(58) Field of Classification Search
CPC ........ H01L 24/97; H01L 24/48; H01L 24/05; H01L 24/13; H01L 24/03; H01L 24/11; H01L 24/83; H01L 24/16; H01L 24/96; H01L 24/85; H01L 24/19; H01L 24/29; H01L 24/73; H01L 24/81; H01L 24/82
(Continued)

(56) References Cited

U.S. PATENT DOCUMENTS 5,234,868 A * 8/1993 Cote ............... B24B 37/013
216/38
5,834,375 A * 11/1998 Chen ............... B24B 37/013
438/692
(Continued)

FOREIGN PATENT DOCUMENTS

EP 2378548 10/2011

OTHER PUBLICATIONS

International Search Report and Written Opinion in co-pending PCT Application No. PCT/US2016/057075 dated Jan. 18, 2017.
(Continued)

*Primary Examiner* — Jarrett J Stark
(74) *Attorney, Agent, or Firm* — Burns & Levinson, LLP; Joseph M. Maraia

(57) ABSTRACT

Systems and methods of in-situ calibration of semiconductor material layer deposition and removal processes are disclosed. Sets of test structures including one or more calibration vias or posts are used to precisely monitor processes such as plating and polishing, respectively. Known (e.g., empirically determined) relationships between the test structure features and product feature enable monitoring of wafer processing progress. Optical inspection of the calibration feature(s) during processing cycles permits dynamic operating condition adjustments and precise cessation of processing when desired product feature characteristics have been achieved.

17 Claims, 15 Drawing Sheets

(51) Int. Cl.
  *H01L 21/308* (2006.01)
  *H01L 21/768* (2006.01)
  *B24B 37/013* (2012.01)
  *B24B 37/04* (2012.01)
  *B24B 37/10* (2012.01)
  *B24B 49/12* (2006.01)
  *H01L 21/321* (2006.01)

(52) U.S. Cl.
  CPC ............ *B24B 49/12* (2013.01); *H01L 21/308* (2013.01); *H01L 21/30625* (2013.01); *H01L 21/76879* (2013.01); *H01L 22/12* (2013.01); *H01L 21/3212* (2013.01); *H01L 22/30* (2013.01)

(58) Field of Classification Search
  USPC ........................................................ 257/48
  See application file for complete search history.

(56) References Cited

U.S. PATENT DOCUMENTS

| | | | |
  |---|---|---|---|
  | 5,972,787 A * | 10/1999 | Boggs | B24B 37/013 216/84 |
  | 6,242,320 B1 * | 6/2001 | So | H01L 21/76251 257/E21.564 |
  | 6,410,357 B1 | 6/2002 | Chang | |
  | 6,629,874 B1 | 10/2003 | Halley | |
  | 6,654,108 B2 | 11/2003 | Ravid | |
  | 7,598,098 B2 * | 10/2009 | Lerner | H01L 22/34 216/60 |
  | 7,752,579 B2 | 7/2010 | Fukuda | |
  | 8,216,928 B1 * | 7/2012 | Richter | H01L 21/82341 257/E21.42 |
  | 2003/0143850 A1 * | 7/2003 | Su | H01L 21/31053 438/692 |
  | 2009/0008794 A1 * | 1/2009 | Wu | B24B 7/228 257/777 |
  | 2015/0262949 A1 | 9/2015 | Osenbach | |

OTHER PUBLICATIONS

Luo et al., "A Layout Dependent Full-Chip Copper Electroplating Topography Model" Advanced Technology Group, Synopsys Inc., Mountain View, CA USA (2005), pp. 133-140.

Wenbiao et al., "Effects of Pattern Characteristics on the Copper Electroplating Process" Institute of Microelectronics, Chinese Acadmey of Sciences, Beijing 10029, China (May 2011) pp. 055010-1-055010-4.

* cited by examiner

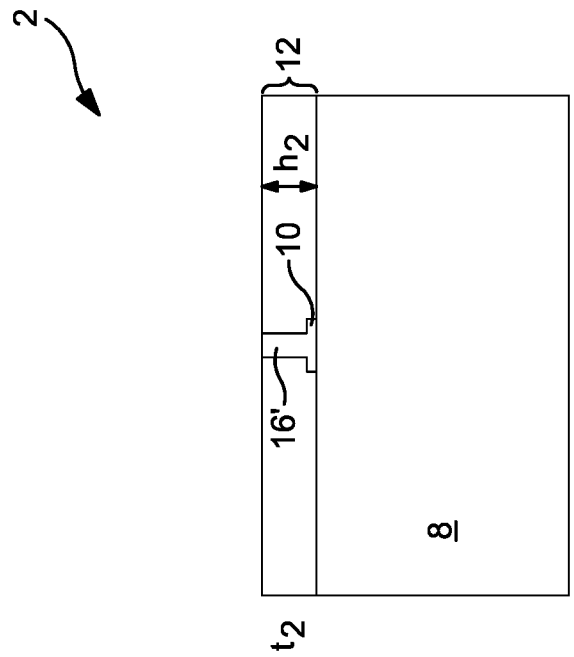
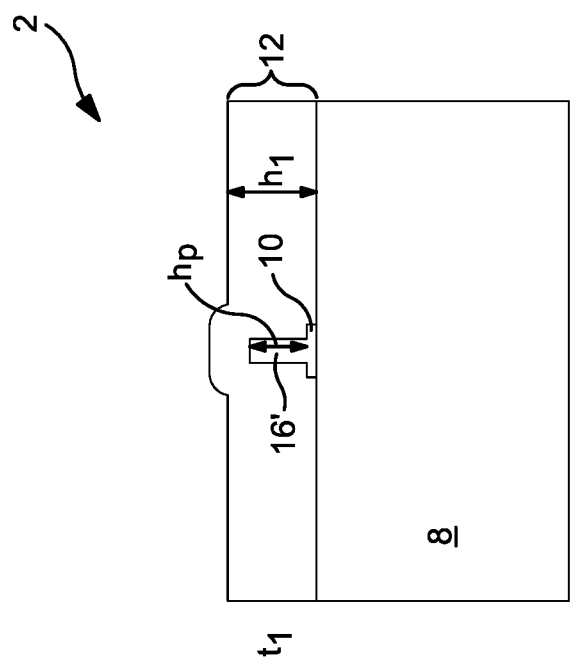

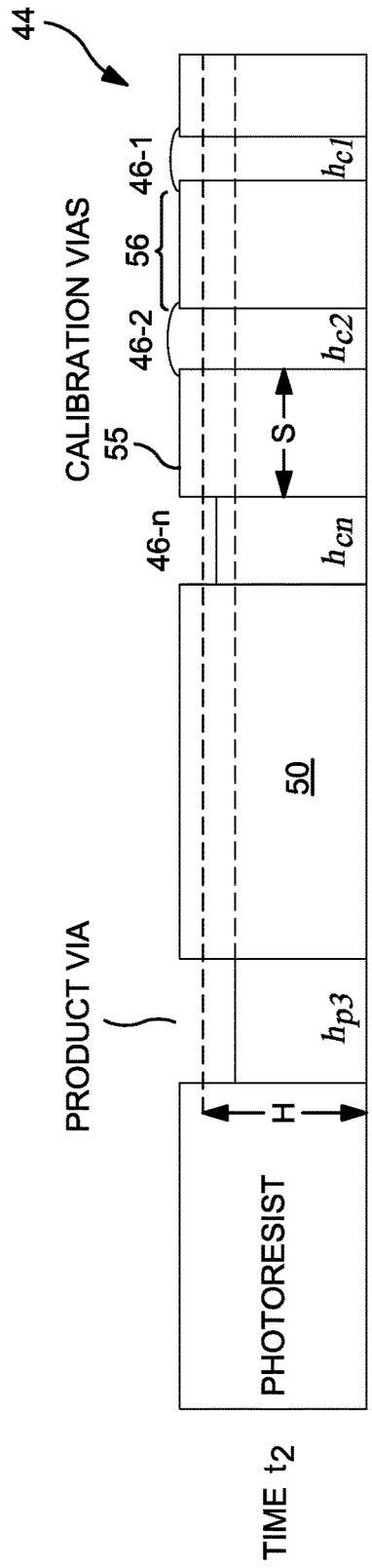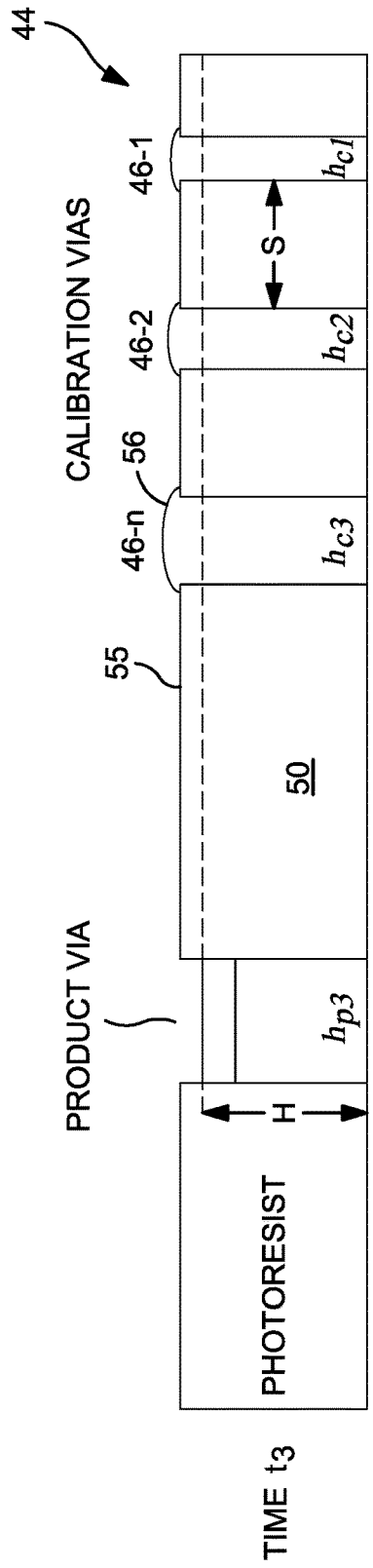

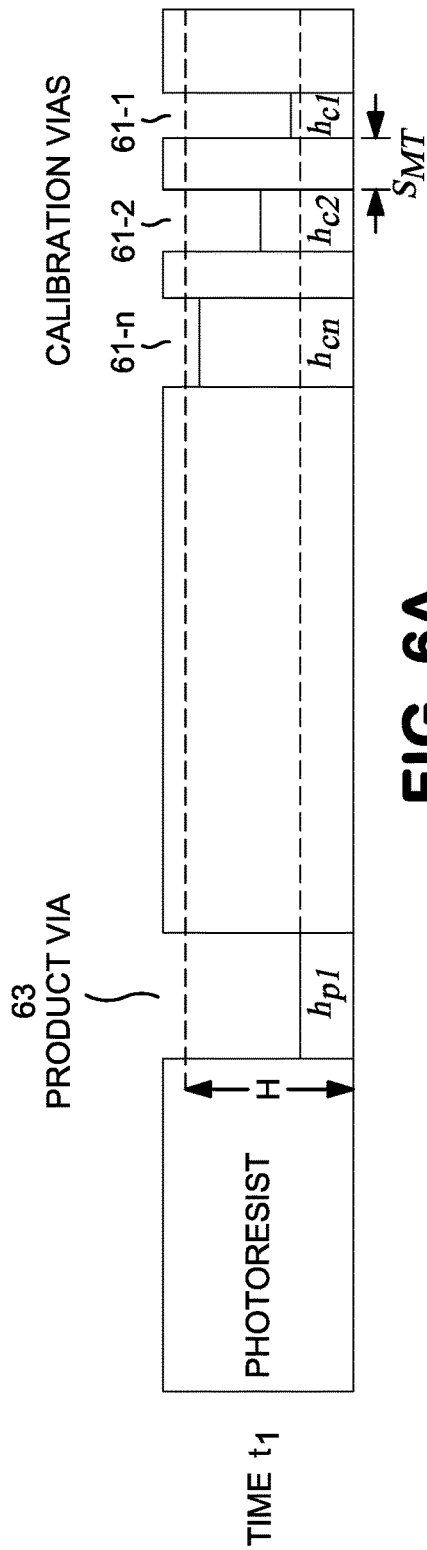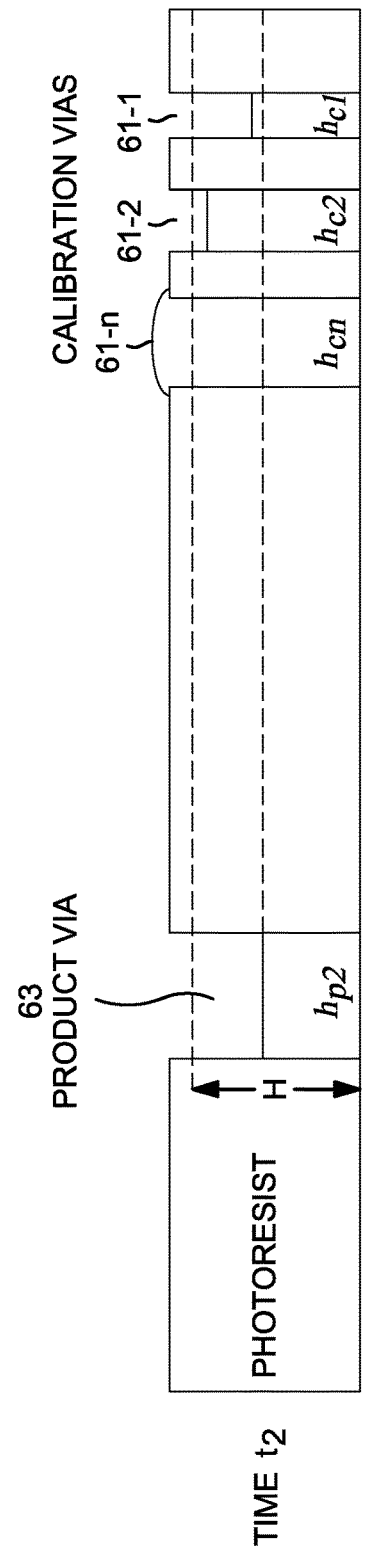

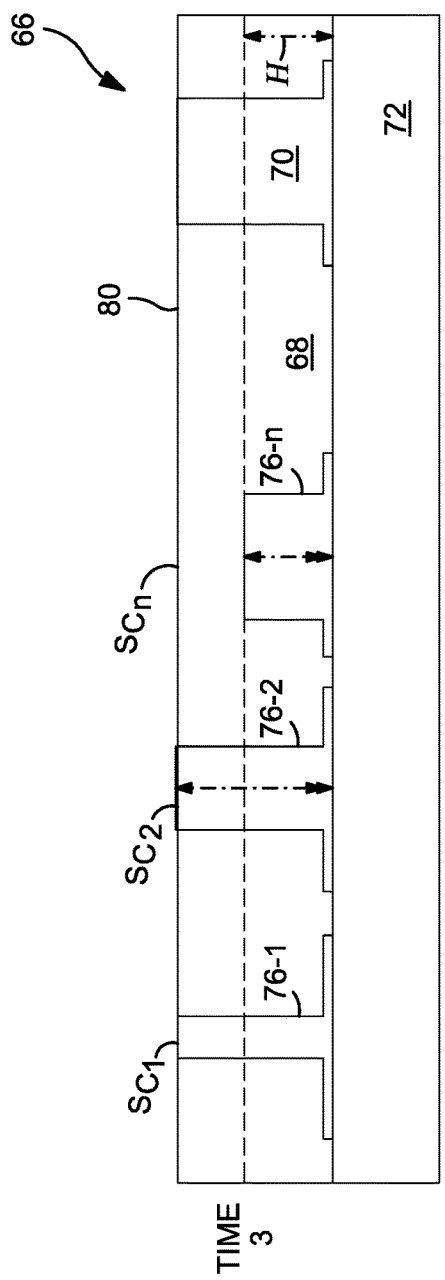
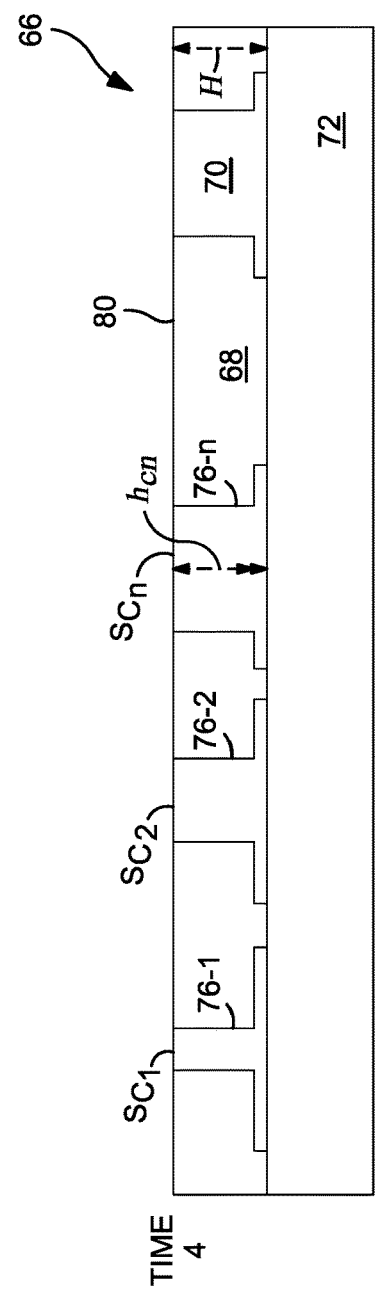

Rough

Smooth

IN-SITU CALIBRATION STRUCTURES AND METHODS OF USE IN SEMICONDUCTOR PROCESSING

FIELD OF THE INVENTION

The invention is generally related to the field of integrated circuit manufacturing, and specifically to test structures and improved in-situ direct feedback monitoring depth during wafer deposition (e.g, electroplating) and/or thinning (e.g, chemical mechanical polishing, CMP) processes, and for determining endpoints for such processes.

BACKGROUND

Semiconductor wafer bonding processes have been developed for bonding two silicon wafers together to form a new wafer, such as wafer 2 shown in FIG. 1A that includes a direct bond hybridization (DBH) structure 4. DBH processing may be used in the formation of a focal plane array comprised of a detector wafer 14 stacked on a read out integrated circuit (ROIC) 8, which includes analog and digital integrated circuits 6, resulting in a SiPIN hybrid sensor. Between the detector wafer 14 and the integrated circuits 6 may be found metal contact layers 10 and a metal interposer layer (e.g., interconnecting posts 16) with an insulating (e.g., oxide) layer 12 encapsulating the metal structures. Detector wafer 14 may be bonded to the ROIC 8 through oxide bonding that enables metal interconnecting posts 16 embedded within the insulating layer(s) 12 to form an interposer connection.

Additional information about an exemplary 3D stacked wafer may be found in "Third Generation FPA Development Status at Raytheon Vision Systems", W. A. Radford, et al., Infrared Technology and Applications XXXI, *Proc. of SPIE* Vol. 5783, and/or data sheets related to the DBI® process developed by Ziptronix, Inc. (a subsidiary of Tessera Technologies, Inc.) and available at http://www.ziptronix.com/technologies/dbi/.

With reference to FIGS. 1B-1D, plating may be used to deposit product features, such as one or more interconnection metal post(s) 16, in a photoresist layer 13 prior to stripping the photoresist and depositing the insulating layer 12. Conventional plating bath manufacturers engineer their baths to achieve reasonably good plating height uniformity across a substrate, despite variation in product feature (e.g., trace lines, vias, etc.) sizes. There are, nevertheless, variations in product feature heights, such as the height $h_p$ of metal post 16', which occur due to variations in the depositing processing conditions (e.g., variations in current distribution in electroplating.) The height $h_p$ of the respective posts 16' and the insulating layers 12 of the detector wafer 14 and ROIC 8 need to be reduced within very tight tolerances to enable proper interconnection during wafer bonding in subsequent wafer stacking operations.

The DBH manufacturing process includes lithographic techniques that result in the formation of metal (e.g., nickel) post structures 16' encapsulated in oxide insulating layers 12. To reveal the metal posts prior to bonding, each insulating layer 12 may be thinned from, for example, initial height hi (at time ti) down to desired height h2 (at time t2) using a wafer thinning process such as CMP.

CMP is often used to planarize and remove material from the insulating oxide layer 12 until the embedded post 16" is revealed (such as shown in FIG. 1D.) With reference to FIG. 2, CMP typically utilizes abrasive slurry to planarize the surface of a wafer 20, through a combination of mechanical and chemical action. Generally, CMP involves pressing onto wafer 20 a polishing pad 22, which may be vacuum-mounted on a rotating carrier head 24. As the wafer 20 and polishing pad 22 come into contact, the surface of the wafer 20 is mechanically and chemically polished. A critical component of any CMP process is endpoint detection. Lacking in-situ direct feedback for measuring wafer thickness during CMP, conventional processes commonly estimate CMP rates and timing to complete a CMP process. However, variations in the chemical or mechanical composition of the slurry, the pad, or the wafer may cause the amount of time needed to polish to the desired depth to vary.

Due to optical interference from the underlying circuitry (i.e., multiple metal routing layers of oxide and metal), optical interferometry methods cannot be used in-situ to measure the actual height of the CMP thinned insulating layer 12. Accurate optical oxide height measurements on the ROIC typically cannot be made on the completed wafer. This may permit adjustment of operating parameters for future wafer processing runs, but it does not account for wafer to wafer variations. If CMP rate of material removal is greater than predicted for the wafer an excess of material will be removed, resulting in over-polishing of the layer and loss of product. Thus processing problems leading to unpredictable polishing rates leave no way to determine the thickness of the structure in-situ, resulting in potentially expensive (e.g., $50 k/wafer) yield losses.

The present implementations provide methods and structures directed to overcoming, or at least reducing the effects of, one or more of the problems set forth above.

SUMMARY OF THE INVENTION

In one embodiment, a calibration method for a material deposition (e.g., metal plating) process is disclosed. A material may be deposited within each of a product feature and one or more calibration via formed in a photoresist layer on a substrate, applying approximately identical depositing conditions across the substrate. At least one of the calibration vias has a cross-sectional dimension such that, when the material is substantially identically deposited within both the product feature and calibration via, a height of the material within the calibration via exceeds the height of the photoresist layer at approximately the same deposition time that the height of the material within the product feature reaches a selected height. The deposition process continues iteratively, with determinations made whether the height of the metal deposited into the first calibration via exceeds the height of the photoresist layer, until the height of the material being deposited into the first calibration via has exceeded the height of the photoresist layer.

In one embodiment, the height determinations involve optical identification of the point at which the height of the material being deposited in the first calibration via exceeds the thickness of the photoresist layer. This may involve observation at the top surface(s) of the photoresist layer proximate the calibration via(s) of a change from a smooth surface to an unsmoothed surface and of increased dimensions of one or more features thereupon, such as caused by mushrooming of the deposited material as it overfills a via and spreads over the immediately surrounding photoresist surface.

In another embodiment, additional calibration vias each having distinct cross-sectional dimensions may be used. The cross-sectional dimensions are selected that a height of the deposited material in each of the respective calibration vias would be greater than the height of the material deposited within the product feature at a given deposition time and under substantially similar depositing conditions, and that when material deposited into the respective calibration exceeds the height of the photoresist layer, a known height for the metal deposited in the product feature is indicated.

In yet another embodiment, a test structure comprised of one or more such calibration vias is disclosed. Additional calibration vias are spaced sufficiently apart to be optically distinguishable, and may be arranged in an array or other configuration for easier inspection. They made also be spaced sufficiently apart from the product region so as to reduce depositing rate varying field effects. The use of calibration test structures as disclosed advantageously permits in process adjustment of operating conditions to the depositing process, and eliminates the need to strip photoresist during the depositing process.

In one implementation, a method of in-situ calibration of a wafer polishing (e.g., CMP) process is disclosed. A plurality of calibration features may be formed on a test region of a substrate that have different, known heights, where at least one of the known heights is approximately the same height as a desired final height for a deposited material layer. A product feature may be formed on a distinct product region of the substrate. Then, a material layer may be deposited onto the product feature and plurality of calibration features, such that a height of the material layer is greater than the desired final height for the deposited material layer and the height of the plurality of calibration features, and that the calibration features are visually observable through the deposited material layer. Iterative polishing cycles may then be applied, under approximately the same polishing conditions the test region and the product region of the material layer, wherein after each polishing cycle, the height to which the material layer has been polished may be determined, through optical observations of changes from rough to smooth of one or more of the calibration features. Each change of a particular calibration feature appearance from rough to smooth indicates a reduction of the material layer height to the corresponding known height of said particular calibration feature. The polishing process may be halted when the determined material layer height is reduced to the desired height, and adjustments to the polishing process may be made in response to the optical observation until the desired height is achieved for that wafer, or for future wafer polishing operations.

A test structure comprised of the calibration features having distinct known heights may be formed by creating a corresponding plurality of vias of different cross-sectional dimensions in photoresist on the substrate, and depositing a material under approximately the same depositing conditions into the plurality of vias for a depositing time less than would cause over-filling in any of the plurality of vias. The photoresist may then be stripped, and the heights of the distinct calibration features may be optically measured.

BRIEF DESCRIPTION OF THE DRAWINGS

The foregoing and other features of the implementations will be apparent from the following, more particular description of exemplary embodiments of the implementations, as illustrated in the accompanying drawings wherein like reference numbers generally indicate identical, functionally similar, and/or structurally similar elements.

FIGS. 1B through 1D are side cross-sectional views of a (prior art) wafer bonding regions, pre-polishing and post-polishing;

FIGS. 4A-4D are cross-sectional side views of an exemplary test structure at four successive points in time during a process for in-situ calibration of plating height;

FIGS. 6A-6D are cross-sectional side views of an exemplary test structure at four successive points in time during a monitored plating process, showing a slower plating rate for a narrow, high aspect ratio calibration via;

FIGS. 8A-8D are cross-sectional side views of an exemplary test structure at four successive points in time during an in-situ process for calibrating material removal;

DETAILED DESCRIPTION

The following detailed description of example implementations refers to the accompanying drawings. The same reference numbers in different drawings may identify the same or similar elements.

Figure 1A:
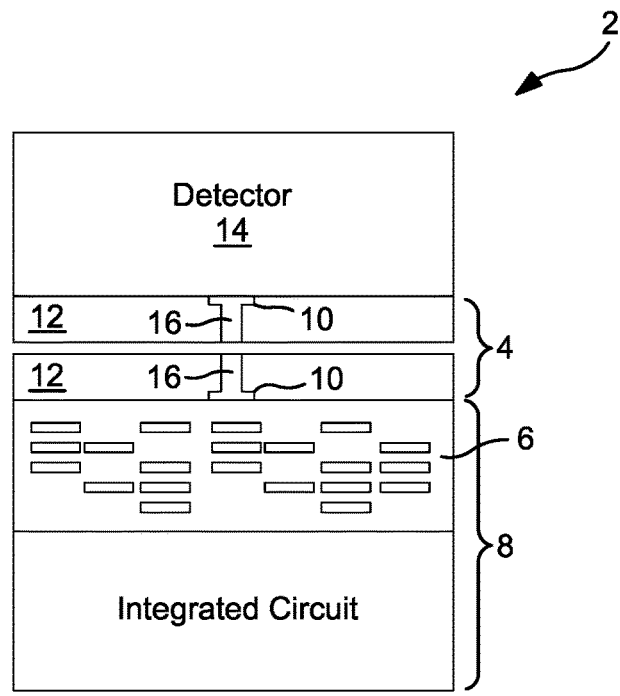
FIG. 1A is a side cross-sectional view of a (prior art) two wafer stack of bonded wafers utilizing direct bond hybridization to form a 3D stacked wafer.
Figure 1B:
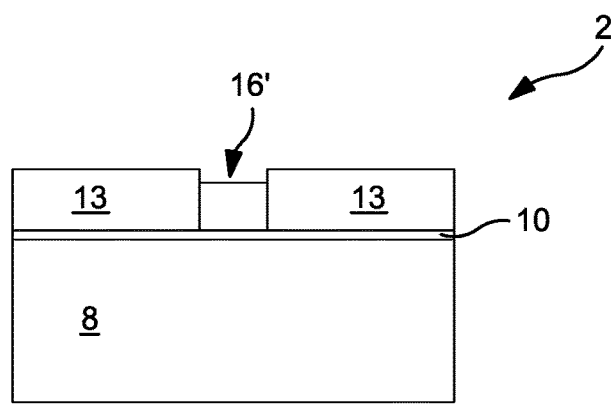

Implementations will now be described that are particularly useful in the formation of 3D stacked wafers, such as wafer 2 in FIG. 1A, which may be a SiPIN hybrid sensor. The implementations include test structures and improved in-situ (e.g., on the same wafer), direct feedback monitoring of wafer and feature depth(s) during deposition and/or thinning processes, such as, respectively, electroplating and/or chemical mechanical polishing (CMP) processes. The implementations also provide methods for determining endpoints for such processes, and for in-situ adjusting of deposition and/or thinning operating conditions. The example implementations of deposition by metal plating and thinning by CMP polishing techniques are not intended to limit the environment of the invention in any way to such processes. Also, the description uses the terms 'channel' and 'via' frequently and interchangeably, but neither term is meant to limit the test features to a particular cross-sectional shape.

Figure 2:
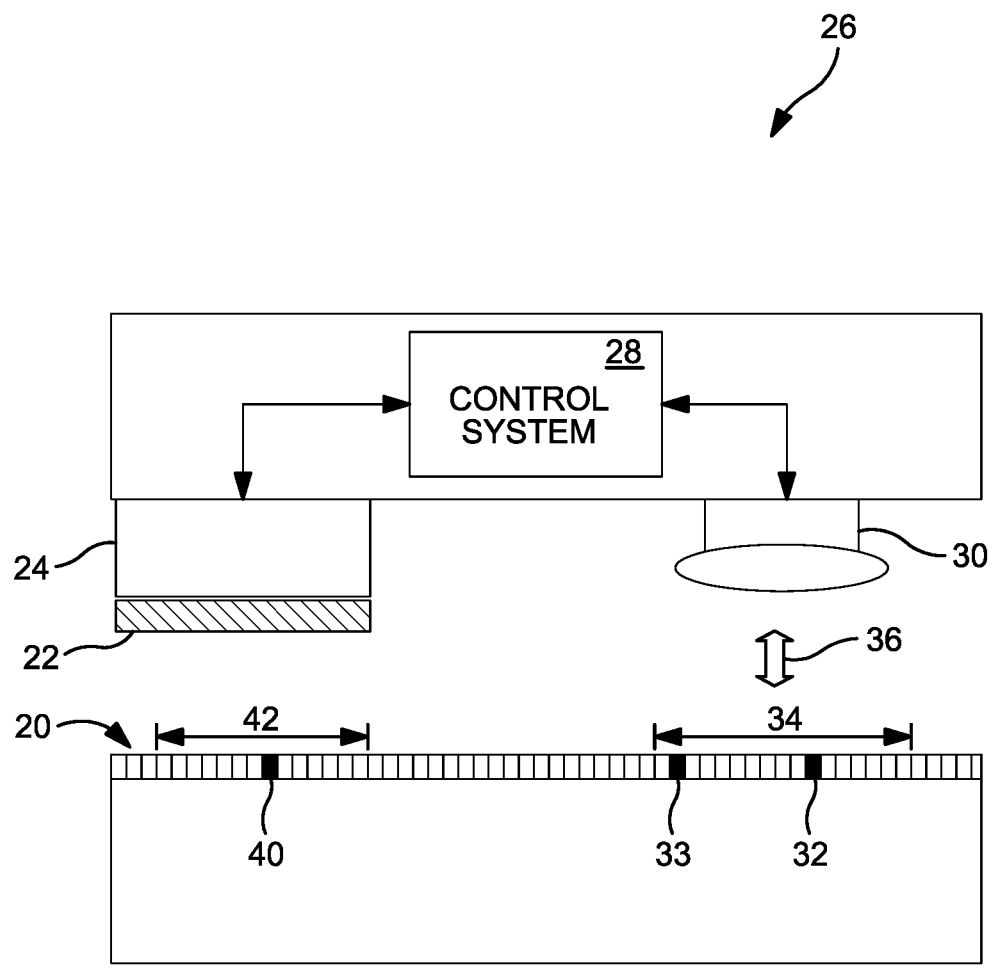
FIG. 2 is a side cross-sectional view of an exemplary system for in-situ calibration of a semiconductor wafer polishing process.

FIG. 2 illustrates an example system 26 for in-situ thickness measurements of features, such as vias, posts, thin films, etc., being formed in a semiconductor wafer 20. System 26 includes a control system 28 for controlling the operating characteristics of the process. The particular processing environment depicted is for CMP thinning of wafer 20, but the environment for wafer feature deposition would be, schematically, quite similar. Conventional operating conditions (time, temperature, chemical concentrations, polishing pressure, etc.) associated with such processes are fairly well characterized in the field, but suffer from deficiencies noted above. Control system 28 may adjust one or more selected operating parameters of the process based on sensed operating conditions associated with the process, and based on in-situ, direct feedback height determinations that the implementations enable.

An optical measurement system 30 is operatively associated with control system 28 and positioned in proximity to wafer 20 in order to non-destructively measure in-situ heights of features of wafer 20 while they are being formed. Measurement system 30 may implement any known technique operable to measure the height of a wafer feature. For example, an interferometer and/or microscope and incident light 36 may be utilized in optical interference, ellipsometry and/or scattering techniques to observe and/or measure at least one known feature, such as calibration features 32, 33 located in a test region 34 formed in wafer 20. Such measurements may be employed to adjust the depositing and/or thinning process to achieve a desired feature height.

Measurement system 30 may be coupled to the control system 28 for providing a signal indicative of the height(s) of measured calibration features 32, 33 during processing. Control system 28 may comprise a processor (i.e., a microprocessor of CPU, not shown) coupled to a memory (not shown). Control system 28 applies known correlations to the height signals for calibration features 32, 33 to make determinations about the height of a product feature 40 (e.g., thin film thickness, interconnecting post height, etc.) formed in a product region 42 of wafer 20. The control system 28 may be programmed and/or configured to determine if processing is proceeding as expected, and what action (e.g, changes in operating conditions, if any) should be taken in order to achieve a desired product feature height. The control system 28 is operatively coupled to controllers (not shown) for various operating condition physical components of the processing system. As a result, the system 26 provides for monitoring process conditions, including material deposition and removal. The height determinations provide data based on which control system 28 may implement feedback process control to form a product feature having a desired thickness, such as a uniform thickness across the substrate.

Those of ordinary skill in the art will readily appreciate that other implementations are possible. For example, while system 26 illustrates optical inspection of wafer 20 occurring on the same instrument surface, wafer 20 could also be removed to another optical inspection location or position. Also, the formation of the test structure implementations disclosed herein need not occur contemporaneously with the formation or polishing of product vias.

Figure 4A:
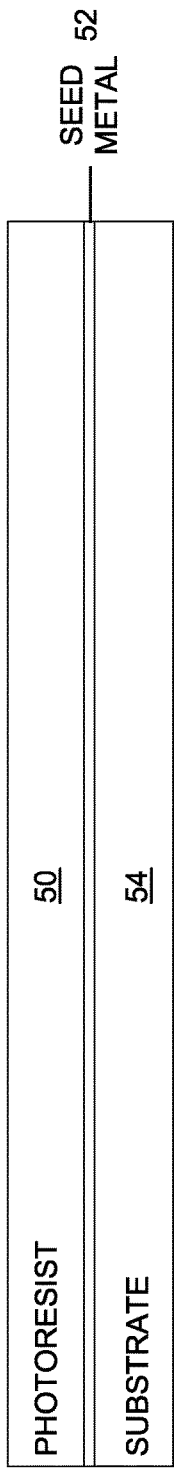
Figure 4B:
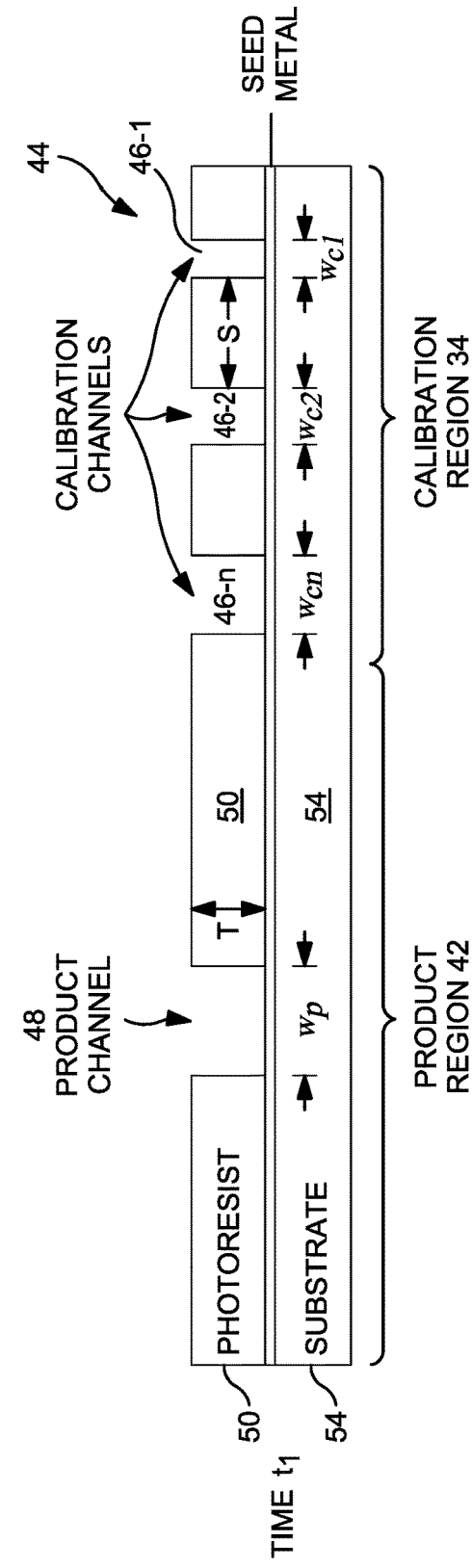

With reference to FIGS. 4B-4D, certain implementations provide a test structure 44 for use in monitoring, and/or determining an endpoint for, a material depositing process, such as a plating process. Test structure 44 includes at least one, but preferably a plurality of variable sized calibration features, such as calibration channels (or vias) 46-1 through 46-n that will plate at faster rates than that of a product feature, such as product channel (or via) 48, and also at rates differing from one another. Calibration vias 46-1 through 46-n and product via 48 are formed in a photoresist layer 50 on top of a substrate comprised of a seed metal layer 52 and a digital and/or analog integrated circuit wafer 54, such as a ROIC wafer.

Calibration vias 46-1 through 46-n, as shown in FIGS. 4B-4D, may be formed in photoresist layer 50 spaced apart by a distance S far enough from one another to be optically distinguishable with optical measurement system 30 (or other optical measurement tool.) In addition, calibration vias 46-1 through 46-n may be arranged in a known configuration, such as an array, for ordered optical inspection.

Calibration vias 46-1 through 46-n each have a corresponding cross-sectional dimension, for example purposes denoted widths $w_{c1}$ through $w_{cn}$. Each width, $w_{c1}$ for example, differs from the cross-sectional dimensions $w_{c2}$ through $w_{cn}$ of the other calibration vias 46-2 through 46-n, in order to affect different plating rates therein. In certain implementations, the largest of the calibration vias, via 46-n, has a width $w_{cn}$ that is no greater than the width $w_p$ of the product via 48. Since smaller diameter vias generally plate at a faster rate under approximately the same depositing conditions than larger diameter vias, each of the calibration vias 46-1 through 46-n, will then plate at rates faster than the product via 48, providing indications of plating progress prior to, and approximately at, completion of product feature plating, i.e., upon a determination that the product via 48 has been plated to a desired height H as shown in FIG. 4D.

FIGS. 4B-4D illustrate a monitored plating process over times $t_1$ through $t_3$. As the plating process proceeds, faster plating features, i.e., the calibration vias 46-1 through 46-n will sequentially over-plate. That is, the plating material (e.g., nickel) will plate sequentially to the respective tops of the calibration vias 46-1 through 46-n and slightly "mushroom", such as shown having occurred in calibration vias 46-1 and 46-2 in FIG. 4C, and then calibration via 46-n in FIG. 4D. The mushroom shape includes a "head" portion 56 that is larger in lateral dimension than its respective calibration via width, as it slightly expands over the top surface 55 of the photoresist layer 50. Each mushroom head 56 may be detected by optical measurement system 30 (or other optical inspection tool) as a loss in smoothness as well as a measurable change in lateral dimensions and/or height of the feature above the photoresist surface. Separation distance S between the calibration vias 46-1 through 46-n is such that over-plating mushroom heads 56 remain optically distinguishable.

The detection of over-plating of a calibration via, for example via 46-2 in FIG. 4C, indicates that a corresponding plating height $h_{c2}$ (equal to the photoresist thickness T) has been attained. Prior experimentation (i.e., process 300 illustrated in FIG. 3A) establishes data calibrating attainment of plating height $h_{c2}$ in calibration via 46-2 to a particular product plating height $h_{p3}$ in product via 48. In FIG. 4D, it can be seen that calibration via 46-n has overplated, which is known to correspond to attainment of the desired plating height H in product via 48. It is worth noting that only one calibration via 46-n whose over-plating corresponds to the desired plating height H in product via 48 is actually necessary to determine the endpoint of the plating process, however a plurality of calibration vias 46 with differing plating rates faster than the product via 48 plating rate will provide greater monitoring resolution and the ability to make in-process adjustments to plating operating conditions.

Figure 3A:
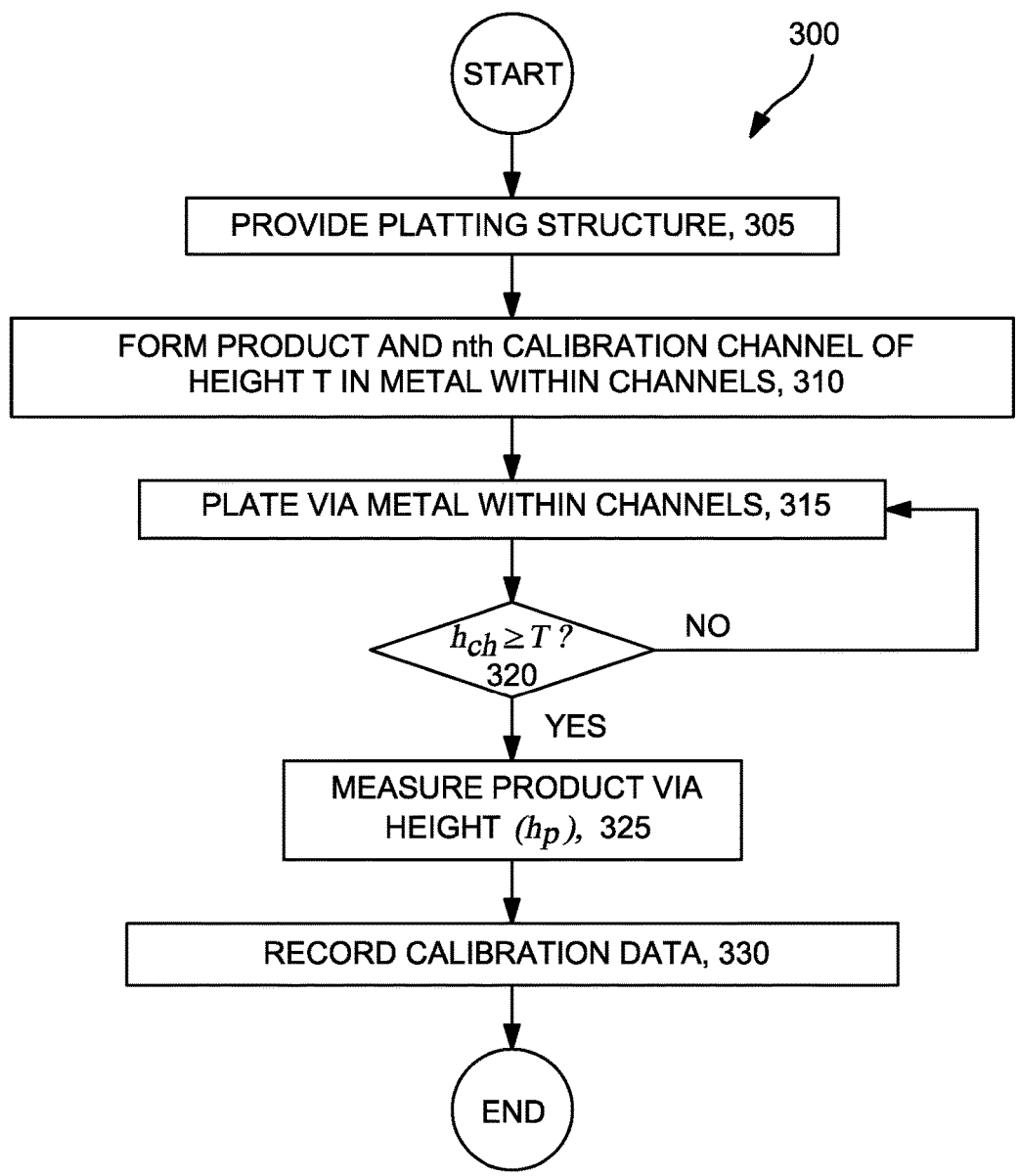
FIG. 3A is a flow diagram of an exemplary process for determining calibration data for a test structure implementation comprising a plurality of calibration plating vias.

With reference to FIG. 3A, an experimental process 300 for establishing calibration data between the over-plating heights $h_{c1}$ through $h_{cn}$ of vias 46-1 through 46-n and plating heights $h_{p1}$ through $h_{pn}$ in product via 48 commences with step 305, where a substrate (such as the surface of a ROIC wafer) is provided. In step 310, an intended product via, such as product via 48, and n calibration vias 46-1 through 46-n may be formed in a photoresist layer 50 of thickness T.

Step 315 commences iterative plating steps, with plating process operating conditions approximately the same for the calibration vias 46-1 through 46-$n$ and product via 48 as will be experienced during non-experimental plating processing. After each plating cycle, at step 320, an optical inspection determines whether any of the calibration vias have overplated (i.e., mushroomed, indicating plating a height T.) Each time that one of the calibration vias 46 mushrooms, the product via plating height $h_p$ is recorded at step 325. This correlation data is recorded at step 330, and the process is repeated until a set of calibration data correlating product via plating heights $h_{p1}$ through $h_{pn}$ for every calibration via 46-1 through 46-$n$ is obtained.

Figure 3B:
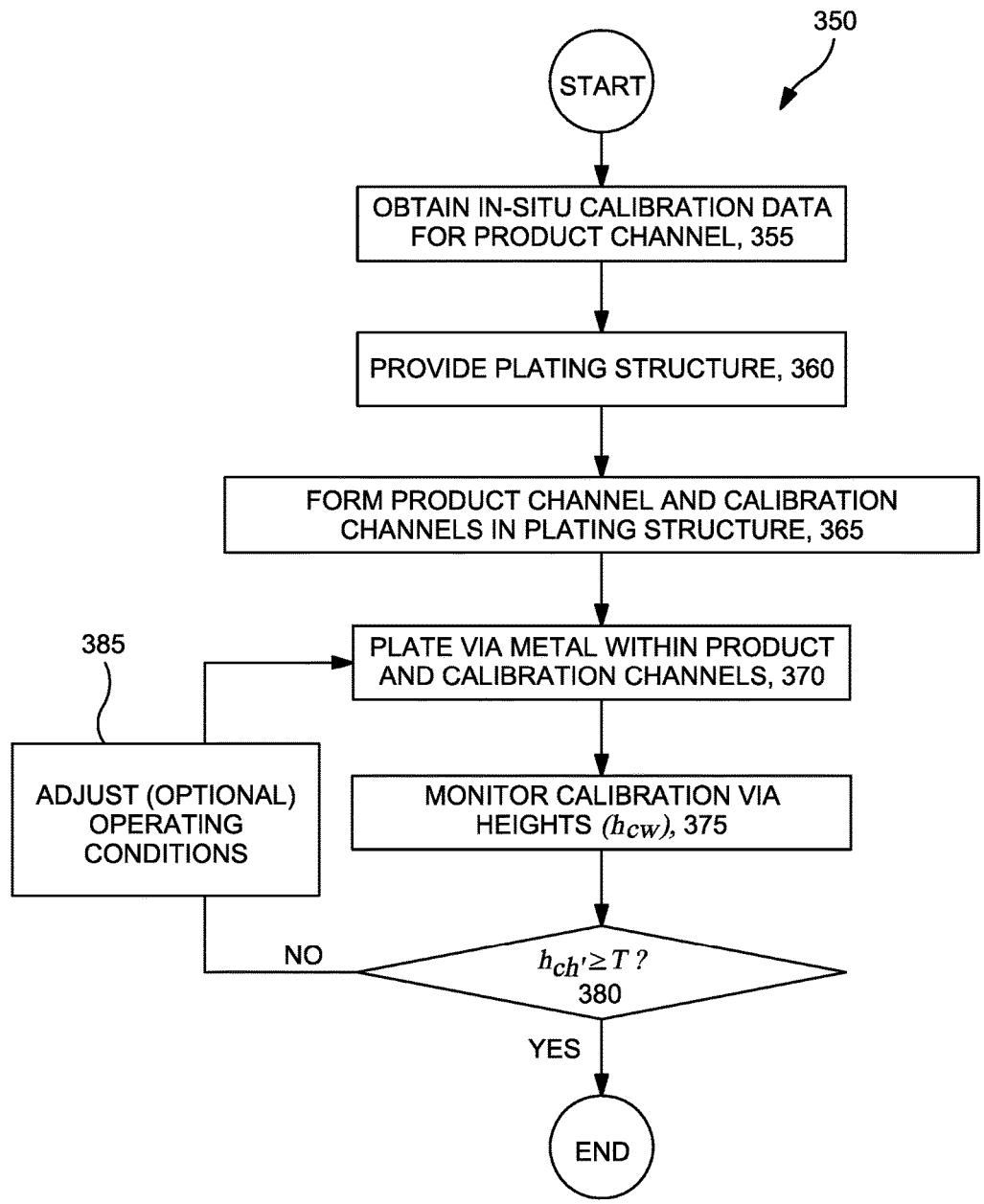
FIG. 3B is a flow diagram of an exemplary process for using a test structure in an in-situ monitoring process for plating.

With reference to FIG. 3B, a process 350 for calibrating the deposition (e.g., plating) of a material to a desired height commences, at step 355, with obtaining a set of plating height calibration data such resulting from process 300. In step 360, a plating structure, such as test structure 44, is provided. In step 365, product features such as, for example, product via 48 and one or more calibration vias 46-1 through 46-$n$ are formed respectively in product region 42 and calibration region 34 in a photoresist layer 50. In step 370, iterative plating cycles commence providing approximately the same plating conditions simultaneously to the product via 48 and calibration vias 46-1 through 46-$n$. After each plating cycle, at step 375, the calibration vias 46-1 through 46-$n$ are optically inspected for over-plating and, at step 380, a determination is made (e.g., by control system 28) whether the calibration via 46-$n$ height $h_{pn}$ is equal to or greater than the product via height T. If the calibration via 46-$n$ that has previously been determined to correlate to a desired product plating height in product via 48 has not been attained, another product plating cycle performed (step 370 again) and, optionally, at step 385, the operating conditions of the plating process may be adjusted. If calibration via 46-$n$ has over-plated, the plating process is halted.

Figure 5A:
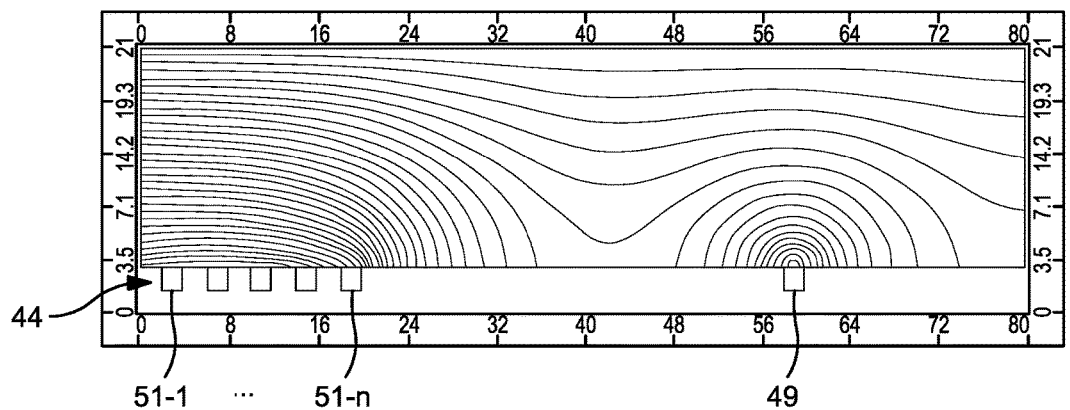
FIG. 5A is a cross-sectional side view of a substrate undergoing plating showing non-uniform fields applied to plated vias.
Figure 5B:
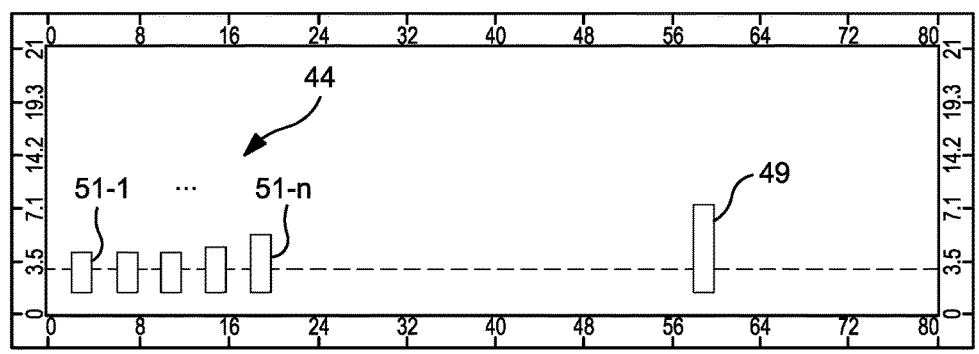
FIG. 5B is a cross-sectional side view of plating height differences in vias of similar dimensions similarly plated, attributable to field variations.
Figure 6C:
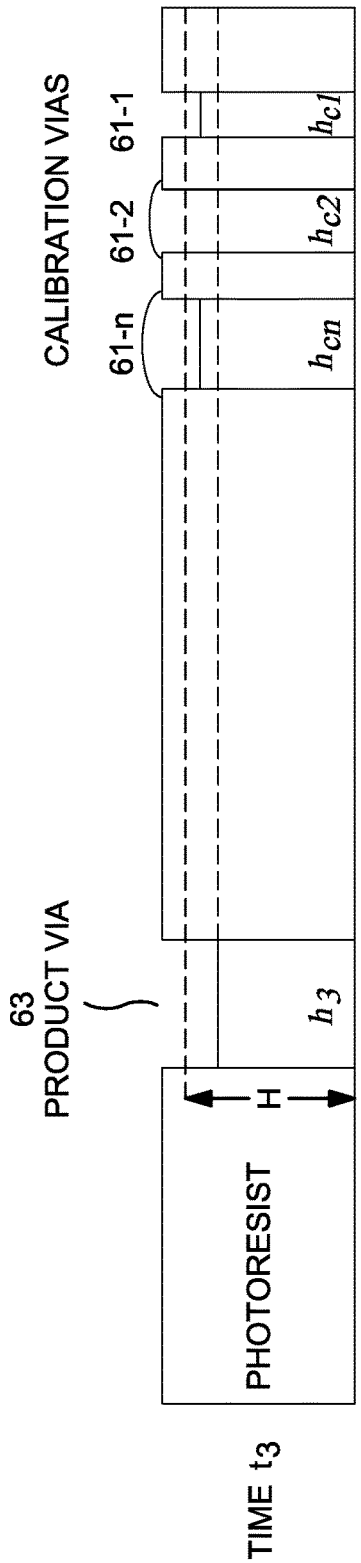
Figure 6D:
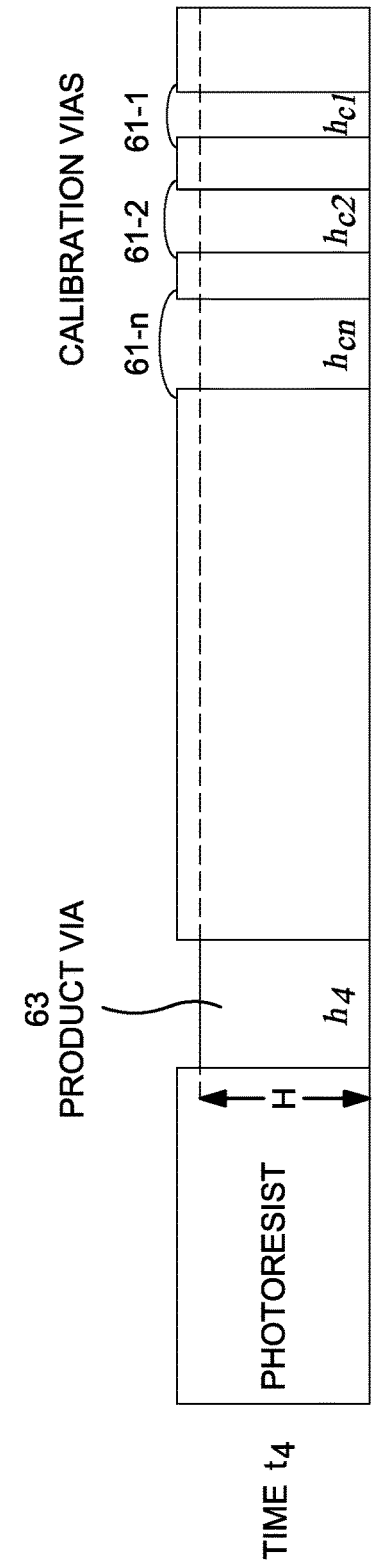
Figure 7:
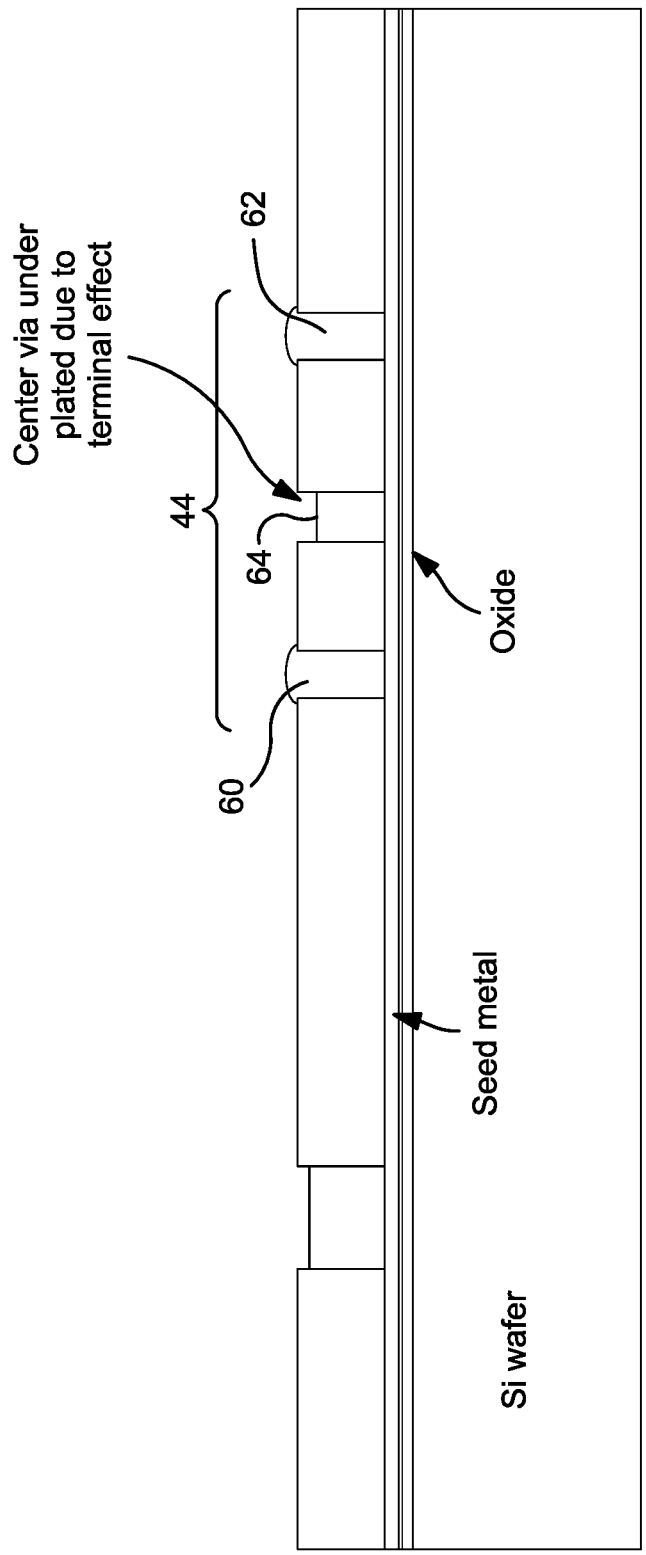
FIG. 7 is a cross-sectional side view of an exemplary test structure at a post plating stage of processing, showing a terminal effect.

Several additional factors may be taken into consideration when designing a plating test structure 44. First, it is known that variations in electrical and/or chemical plating fields caused by the proximity of a via 51-1 to other vias 51-2 through 51-$n$ and 49 (e.g., at least in part due to field effects such as shown in FIG. 5A) may affect the plating rate of any particular via. FIG. 5B illustrates resulting differences in plating heights attributable to such field variations, as observed in vias of similar dimensions. Calibration vias 51-1 through 51-$n$ may be judiciously arranged with appropriate spacing so as to reduce, or increase, plating rate effects attributable to this phenomenon. Also, as shown in FIGS. 6A-6D, while it is generally the case that smaller dimensioned vias plate at a faster rate than larger vias, it is also known that narrow, high aspect ratio vias, such as calibration vias 61-1 and 61-2, may inhibit the diffusion of plating reactants when compared to calibration via 61-$n$ or product via 63, for example. Thus, vias having such dimensional characteristics may actually plate at a slower rate than larger vias, such as shown in FIGS. 6B-6D wherein high aspect ratio via 61-1 plates slower than lower aspect ratio vias 61-2 through 61-$n$ and product via 63. Another test structure 44 design consideration is illustrated in FIG. 7, where it has been observed that plating currents may more easily reach edge vias 60, 62 in a test structure array 44 than center via(s) 64, referred to as a "terminal effect". For example, edge vias 60, 62 surrounding center via 64 may reduce the plating current to center via 64, resulting in a shortened plating height. Each of these factors may be strategically employed to design calibration via test structures that are more sensitive to plating conditions. Once a design is fixed, calibration data is gathered experimentally, as described above.

A significant benefit of the deposition calibration methods is that the visual inspections and associated product height determinations are made without needing to strip the photoresist. If the desired product via height has not been reached after a plating step, the wafer may be returned to the plating solution for reworking until the desired product height is achieved.

FIGS. 8A-8D illustrate an implementation of an in-situ test structure 66 and method particularly useful in calibrating a semiconductor wafer thinning process, such as a CMP process. CMP processing involves planarizing and removing material from a deposited layer 68, which may comprise an insulating material such as $SiO_2$, and features embedded therein, until a product feature, such as a (e.g., Ni) product post 70, is revealed. It is desirable to stop the CMP process, as precisely as possible, at the point where the product post 70 is revealed, in order to yield a wafer structure that enables proper bonding. As noted earlier, conventional CMP process control employs timed CMP rates to target a desired final desired height H of the deposited layer 68 and product post 70. Timed processes provide no way to verify the actual height, due to optical interference from integrated circuitry layer 72 (e.g., ROIC wafer layer) below.

Figure 8A:
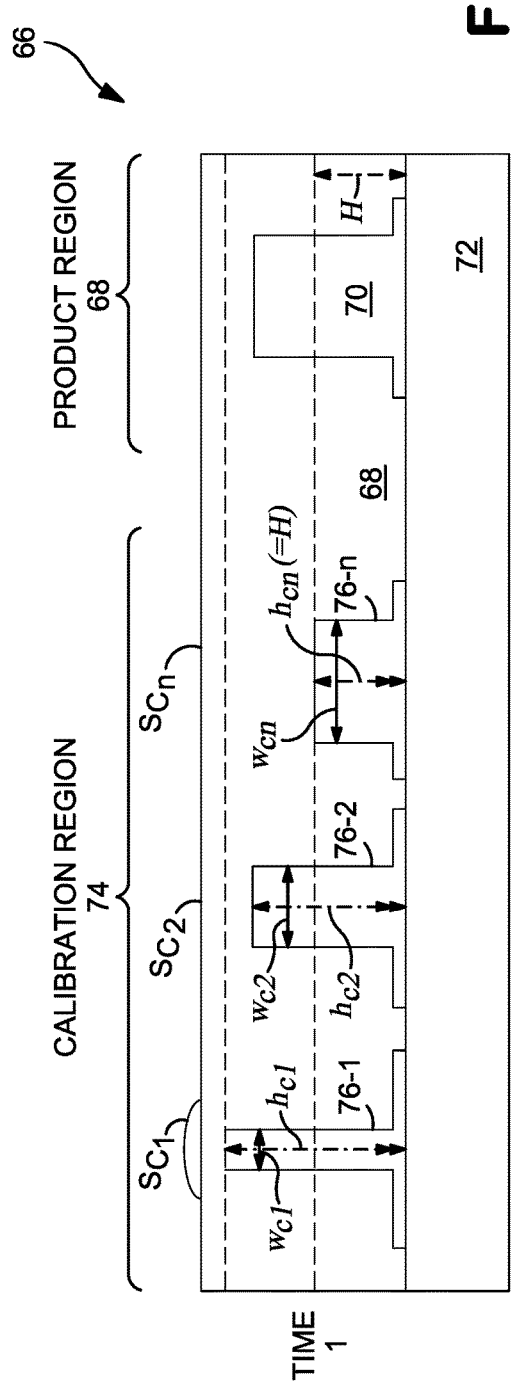
Figure 8B:
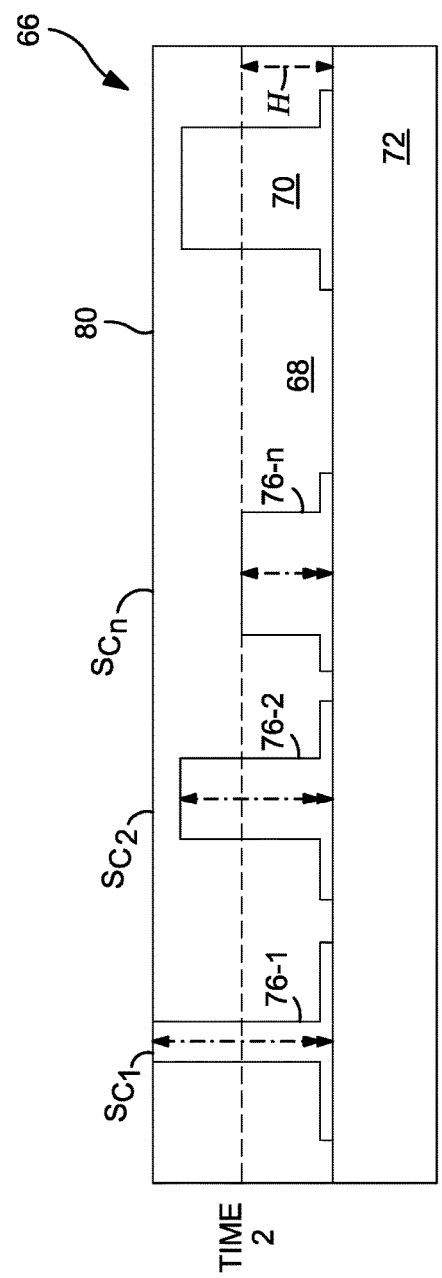

The test structure 66 is formed in a calibration region 74 of deposited layer 68, and is defined by at least one, but preferably a plurality of spaced apart, variable height calibration features, such as calibration posts 76-1 through 76-$n$. Product post 70 is formed in a product region 78 of deposited layer 68 that is distinct from the calibration region 74. Calibration posts 76-1 through 76-$n$ each have corresponding heights $h_{c1}$ through $h_{cn}$ that differ from one another, and one of the calibration post heights (e.g., $h_{cn}$) is approximately the same as a desired post-polishing height H for the deposited layer and the features embedded therein. The variable heights $h_{c1}$ through $h_{cn}$ may be achieved by forming the calibration posts through plating in a photoresist layer a plurality of vias of variable cross-sectional widths $w_{c1}$ through $w_{cn}$ (as shown in FIG. 8A). As described above, vias with smaller cross-sectional dimension typically plate at faster rates than vias having larger cross-sectional dimensions, under the same plating conditions. After forming the calibration post vias, a plating operation is performed for a period of time expected to cause one of the formed posts (e.g., post 76-$n$) to have a height approximately the same as the desired final height H. The calibration post forming process may also utilize depletion techniques to accentuate features. The variable height calibration posts 76-1 through 76-$n$ may preferably be spaced far enough apart from one another to be optically distinguishable with the optical measurement system 30 (or other optical inspection tool, such as a Wyko 3D interferometer), and they may be configured in a known pattern, such as an array, such that their respective revelation at the polished surface 80, following successive polishing operations, occurs in a predictable progression.

After the variable height calibration posts 76-1 to 76-$n$ are formed in a photoresist layer 68, the photoresist is stripped and the respective heights $h_{c1}$ through $h_{cn}$ of the calibration posts may be measured. The optical measurement system 30 may perform this measurement, and the measured heights $h_{c1}$ through $h_{cn}$ may be mapped to the calibration posts 76-1 to 76-$n$ and stored by control system 28.

Figure 9:
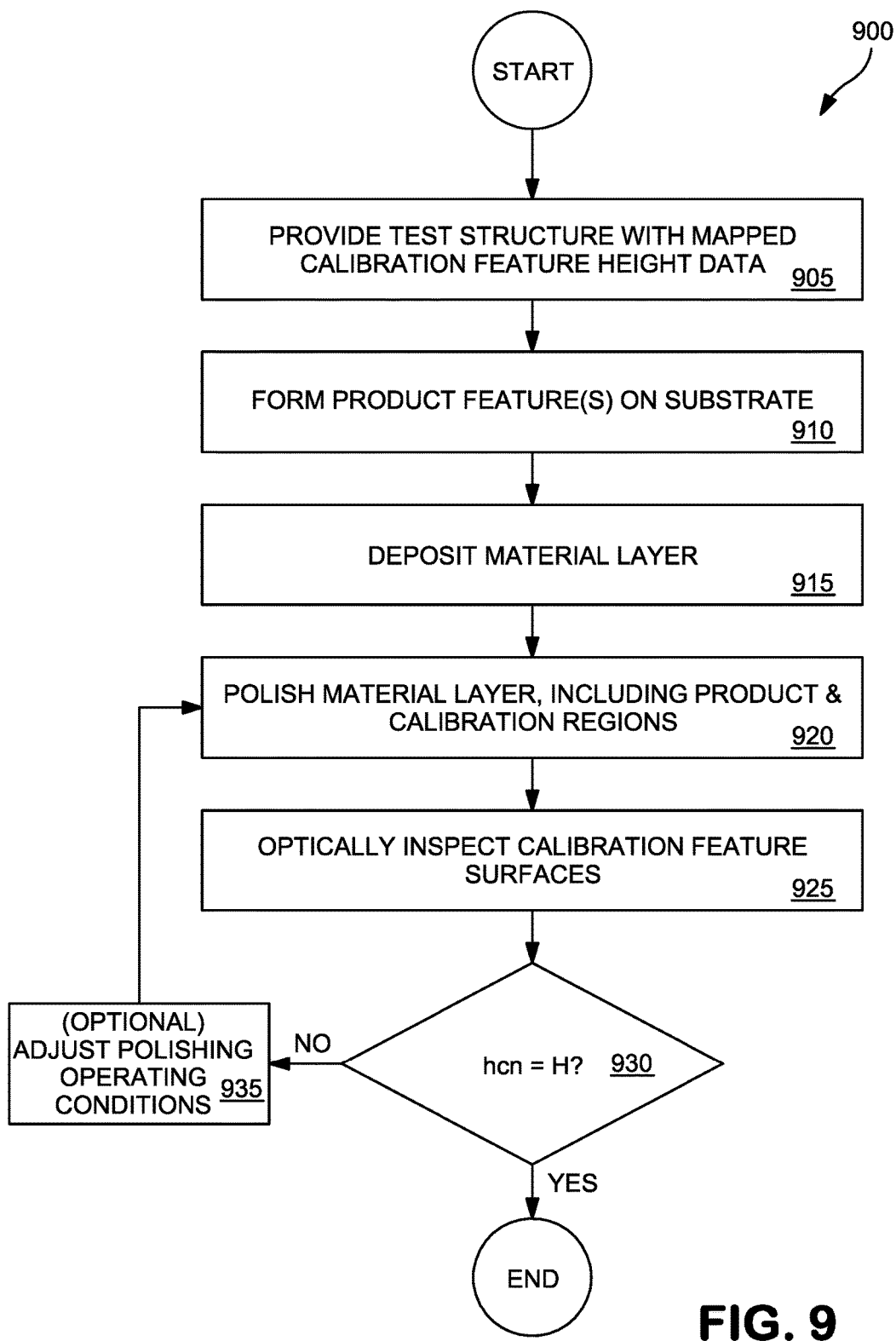
FIG. 9 is a flow diagram of an implementation of a process for in-situ calibration of material removal by polishing.

With additional reference to FIG. 9, an implementation of a method 900 of calibrating in-situ the reduction in height of a polished wafer layer will now be described. At step 905, a substrate such as a surface of integrated circuit 72 is provided with test structure 66 formed thereupon comprised of one or more calibration posts 76-1 to 76-n having corresponding known heights $h_{c1}$ through $h_{cn}$. At least one of the calibration post heights (e.g., post 76-n) is approximately the same height as a desired final height H for the deposited layer 68 that is deposited in step 915, after a product feature such as product post 70 is formed (step 910) on the substrate in a product region. The deposited layer 68 may entirely coat the product post 70, and all of the calibration posts 76-1 to 76-n, but the calibration posts may be visually observable at their mapped locations by measurement system 30 (or other optical inspection tool), appearing as rough surface region $S_{c1}$ to $S_{cn}$ (as shown in FIGS. 8A-8D).

At steps 920 and 925, an iterative polishing (e.g., CMP) and calibration post height visual inspection process is performed. FIGS. 8A-8D illustrate the effect on the material layer 68, calibration posts 76-1 to 76-n, and product post 70 of successive polishing operations at four distinct times $t_1$-$t_4$. As the CMP progresses, an operator may visually observe the calibration post surface regions $S_{c1}$ to $S_{cn}$. As the posts are revealed at the polished surface 80, they are rendered smooth. The clearing, or smoothed appearance, of a particular calibration post surface $S_{cn}$ (for example) indicates the attainment of the known height of that calibration post $h_{cn}$, which is also the current height (or thickness) remaining in the deposited layer 68 (and product post 70, as well, if it has been similarly or previously revealed for polishing at surface 80.) At step 930, a determination is made, based on the currently observed calibration post height $h_{cn}$, whether the desired height H for the deposited layer and embedded features has been attained. If not, CMP processing proceeds until the desired height H, or thickness, is achieved, with or without an optional adjustment (step 935) to the polishing operating conditions.

Figure 10A:
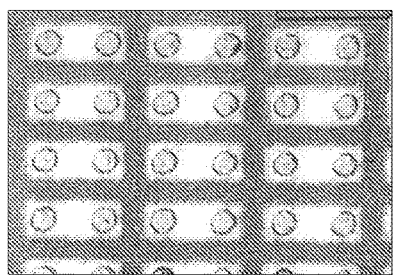
FIGS. 10A-10D are microphotographs (top perspective) of exemplary calibration posts, illustrating roughness prior to polishing and smoothness post-polishing.
Figure 10B:
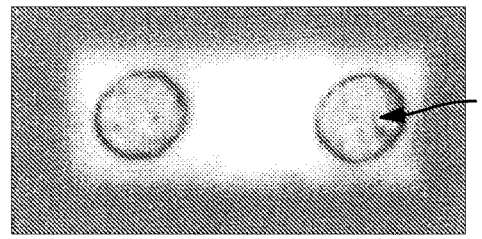
Figure 10C:
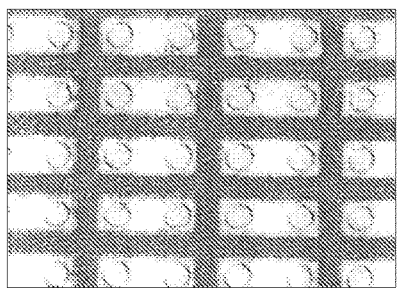
Figure 10D:
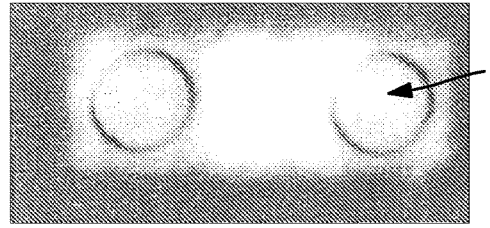

FIGS. 10A-10D are microscopic photographs demonstrating the difference between rough and smoothed surfaces $S_{c1}$ to $S_{cn}$ exemplary calibration posts 76. FIGS. 10A and 10B show photos taken from above calibration posts that have not cleared the insulating layer surface 80 (as in FIG. 8A.) The embedded posts are observable, but their respective top surfaces $S_{c1}$ to $S_{cn}$ appear rough, as the posts have not yet been exposed to polishing. Alternatively, FIGS. 10C and 10D show the observable smoothing effect of CMP pad polishing on the revealed top surfaces of the calibration posts (e.g., as illustrated in FIG. 8D.)

A significant advantage of these implementations is that the optical examination of the posts may be performed in-situ immediately after each CMP cycle, and before irreversible over-polishing occurs.

Although various specific embodiments and illustrative features have been described, it will be recognized that the invention is not thus limited, except as by the appended claims, and that variations, modifications and other embodiments are contemplated and are to be broadly construed. No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "has," "have," "having," or the like are intended to be open-ended terms. Further, the phrase "based on" is intended to mean "based, at least in part, on" unless explicitly stated otherwise.

What is claimed is:

1. A method of in-situ calibration of a wafer polishing process, comprising the steps of:
   forming on a test region of a substrate a plurality of calibration features of different known heights, at least one oldie known heights being approximately the same height as a desired final height for a deposited material layer;
   forming on a product region of the substrate a product feature;
   depositing the material layer onto the product feature and plurality of calibration features, such that a height of the material layer is greater than the desired final height for the deposited material layer and the height of the plurality of calibration features, and that the calibration features are visually observable through the deposited material layer;
   polishing under approximately the same polishing conditions the test region and the product region of the material layer; and
   determining a polished height to which the material layer has been polished through optical observation of changes from rough to smooth of one or more of the calibration features, each change of a particular calibration feature appearance from rough to smooth indicating reduction of the material layer height to the known height of said particular calibration feature.

2. The method of claim 1, further comprising halting polishing when the determined material layer height is reduced to the desired height.

3. The method of claim 1, wherein forming calibration features of different known heights comprises:
   forming a corresponding plurality of vias of different cross-sectional dimensions in a photoresist on the substrate;
   depositing a material under approximately the same depositing conditions into the plurality of vias for a depositing time less than would cause over-filling in any of the plurality of vias;
   stripping the photoresist; and
   optically measuring the heights of the plurality of calibration features.

4. The method of claim 1, wherein the deposited material layer comprises an oxide layer.

5. The method of claim 1, wherein at least one of the calibration features and product feature is comprised of a metal post.

6. The method of claim 1, further comprising, in response to determining the height to which the material layer has been polished, adjusting operating conditions of the polishing process.

7. The method of claim 1, wherein the plurality of calibration features are formed simultaneously on the test region.

8. The method of claim 1, wherein the plurality of calibration features are vias formed with varying cross-sectional dimensions.

9. The method of claim 1, wherein:
   the plurality of calibration features are arranged in a fixed design; and
   the known heights are determined based on calibration data gathered experimentally based upon the fixed design in which smaller cross-sectional dimension vias form at a faster rate than larger cross-sectional dimension vias under a same plating conditions so that the respective heights are different.

10. The method of claim 9, further comprising the step of adjusting the same polishing conditions based upon the optical observation of a current height, a remaining depth to the desired height and the calibration data.

11. The method of claim 10, wherein the determining step occurs before over-polishing and an adjustment of the same polishing conditions is selected from the group consisting of time, temperature, chemical concentration, polishing pressure and combinations thereof.

12. The method of claim 1, wherein the plurality of calibration features are posts that are spaced far enough apart to be optically distinguishable and the product feature is a post.

13. The method of claim 1, wherein the material layer entirely coats the plurality of calibration features.

14. The method of claim 1, wherein widths of the calibration features are no greater than a width of the product feature.

15. The method of claim 1, wherein at least one of the calibration features is formed in a via having a narrow width and overplated to form a head portion having a larger lateral dimension than the narrow width so that the head portion is optically distinguishable.

16. A method of in-situ calibration of a wafer polishing process, comprising the steps of:
arranging a fixed design for a plurality of calibration posts, each post being formed in a respective via, wherein: the calibration posts in smaller cross-sectional dimension vias form at a faster rate than the calibration posts in larger cross-sectional dimension vias under a same plating condition;
experimentally determining calibration data for the fixed design under desired plating conditions, wherein the calibration data represents periods of time for the calibration posts to reach a plurality of desired final heights;
forming the plurality of calibration features in a test region)la substrate using the desired plating conditions, wherein the calibration features have different heights that are known based upon the calibration data with at least one of the known heights being approximately a target final height for a material layer;
forming a product feature in a product region of the substrate;
depositing the material layer onto the product feature and plurality of calibration features, such that a height of the material layer s greater than the target final height for the material layer so that the calibration features are visually observable through the material layer;
polishing the test region and the product region under approximately a same polishing condition; and
stopping polishing upon determining an actual height to which the material layer has been polished through optical observation of changes of the at least one calibration feature having the target final height, wherein the optical observation is the at least one calibration feature having the target final height transitioning from a rough to a smooth appearance.

17. The method of claim 16, wherein:
the at least one calibration feature having the target final height is mushroom-shaped with a distal head; and
the optical observation is removal of the distal head.

* * * * *